United States Patent [19]
Kim

[11] Patent Number: 6,157,585
[45] Date of Patent: Dec. 5, 2000

[54] REDUNDANCY CIRCUIT AND METHOD OF FERROELECTRIC MEMORY DEVICE

[75] Inventor: Duck Ju Kim, Ichon-shi, Rep. of Korea

[73] Assignee: Hyundai Electronics Industries Co., Ltd., Ichon-shi, Rep. of Korea

[21] Appl. No.: 09/343,484

[22] Filed: Jun. 30, 1999

[30] Foreign Application Priority Data

Jun. 30, 1998 [KR] Rep. of Korea ...................... 98-25295

[51] Int. Cl.[7] ...................................................... G11C 7/00
[52] U.S. Cl. ...................... 365/200; 365/145; 365/230.06
[58] Field of Search ................................... 365/200, 145, 365/230.06, 207, 203, 189.07, 190, 230.08, 65

[56] References Cited

U.S. PATENT DOCUMENTS

| | | | |
|---|---|---|---|
| 5,355,339 | 10/1994 | Oh et al. ................................. | 365/200 |
| 5,523,974 | 6/1996 | Hirano et al. ............................ | 365/200 |
| 5,576,999 | 11/1996 | Kim et al. ............................... | 365/200 |
| 5,726,930 | 3/1998 | Hasegawa et al. ...................... | 365/145 |
| 5,761,222 | 6/1998 | Baldi ...................................... | 371/40.18 |
| 5,812,466 | 9/1998 | Lee et al. ................................ | 365/200 |
| 5,828,599 | 10/1998 | Herdt ..................................... | 365/185.08 |
| 5,862,086 | 1/1999 | Makimura et al. ..................... | 365/200 |

FOREIGN PATENT DOCUMENTS 9-180492 7/1997 Japan .

Primary Examiner—David Nelms
Assistant Examiner—Thong Le
Attorney, Agent, or Firm—Jacobson, Price, Holman & Stern, PLLC

[57] ABSTRACT

There is provided a redundancy circuit of a ferroelectric memory device capable of performing a repair software-wise, the redundancy circuit of a ferroelectric semiconductor device having an address buffer, a normal decoder, a normal memory cell array and a redundancy circuit, said redundancy circuit comprises: a redundancy memory cell array; a first programming unit for storing a fail address signal; a second programming unit for storing a fail number signal; a controller for generating control signals which control the first programming unit and the second programming unit; an address comparator for comparing the fail address stored in the first programming unit with the address of the address buffer; and a redundancy decoder for activating the normal memory cell array or the redundancy memory cell array, according to the address of the address buffer, the output signal of the address comparator and the output signal of the second programming unit. Also, a redundancy method is disclosed.

15 Claims, 7 Drawing Sheets

REDUNDANCY CIRCUIT AND METHOD OF FERROELECTRIC MEMORY DEVICE

BACKGROUND OF THE INVENTION

The present invention relates to redundancy circuit and method, and more particularly, redundancy circuit and method of a ferroelectric memory device for software-wise repairing a failed normal memory cell by using a redundancy memory cell.

In realizing a memory device, when some cells of arrayed cells are failed, it is wasteful to remove the whole of a memory device. Thus, a memory device, such as DRAM (dynamic random access memory), generally includes a redundancy circuit for repairing a failed normal memory cell by using a redundancy memory cell.

A redundancy circuit of a ferroelectric memory device, such as FRAM(ferroelectric random access memory), has employed a traditional DRAM redundancy circuit. As a traditional redundancy circuit employs a hardware-wise method, i.e., the circuit cuts the repair fuse involved in a decoder, the circuit cannot repair the memory device which a package has been completed. Namely, when fail is founded at a burn-in test after packaging, the failed chip cannot be repaired, so the chip must be burned up. Accordingly, the yield of a memory device is greatly decreased.

SUMMARY OF THE INVENTION

An object of the present invention is to provide a redundancy circuit and method of a ferroelectric memory device capable of realizing a repair software-wise.

As known to, when both ends of a ferroelectric capacitor have 0V, the capacitor can store a binary data without supplying power. A ferroelectric capacitor is used to a storing unit of a memory device, because it has a non-volatility characteristics.

The present invention is a redundancy circuit and method of a ferroelectric memory device using the non-volatility characteristic of a ferroelectric capacitor, the invention provides a redundancy circuit of a ferroelectric memory device having an address buffer, a normal decoder, a normal memory cell array and a redundancy circuit, said redundancy circuit comprises: a redundancy memory cell array; a first programming unit for storing a fail address signal; a second programming unit for storing a fail number signal; a controller for generating control signals which control the first programming unit and the second programming unit; an address comparator for comparing the fail address stored in the first programming unit with the address of the address buffer; and a redundancy decoder for activating the normal memory cell array or the redundancy memory cell array, according to the address of the address buffer, the output signal of the address comparator and the output signal of the second programming unit.

Also, the present invention provides a redundancy method of a ferroelectric semiconductor device having an address buffer, a normal decoder, a normal memory cell array and a redundancy circuit, said redundancy circuit comprising a redundancy memory cell array, a first programming unit for storing a fail address signal, a second programming unit for storing a fail number signal, a controller for generating control signals which control the first programming unit and the second programming unit, an address comparator for comparing the fail address stored in the first programming unit with the address of the address buffer, and a redundancy decoder for activating the normal memory cell array or the redundancy memory cell array, said method comprising the steps of:

(1) outputting a number of control signals for controlling the first programming unit and the second programming unit by the controller after a burn-in test;

(2) storing the fail number in the second programming unit and the fail addresses in the first programming unit respectively by the control signals;

(3) after a power turning on, rereading the stored fail number and the fail address by the control signals, and storing the data of those in the second programming unit and the first programming unit respectively;

(4) inputting an address in the address buffer;

(5) comparing the fail address stored in the first programming unit with the address of the address buffer, and outputting the result of the comparison as an output signal;

(6) selectively activating the normal memory cell array or the redundancy memory cell array, according to the address of the address buffer, the output signal of the address comparator and the output signal of the second programming unit.

BRIEF DESCRIPTION OF THE DRAWING

The object, features and advantages of the present invention are understood within the context of the description of the preferred embodiment as set forth below. The description of the preferred embodiment is understood within the context of accompanying drawing. Which form a material part of this disclosure, wherein.

DESCRIPTION OF THE PREFERRED EMBODIMENT

Figure 1:
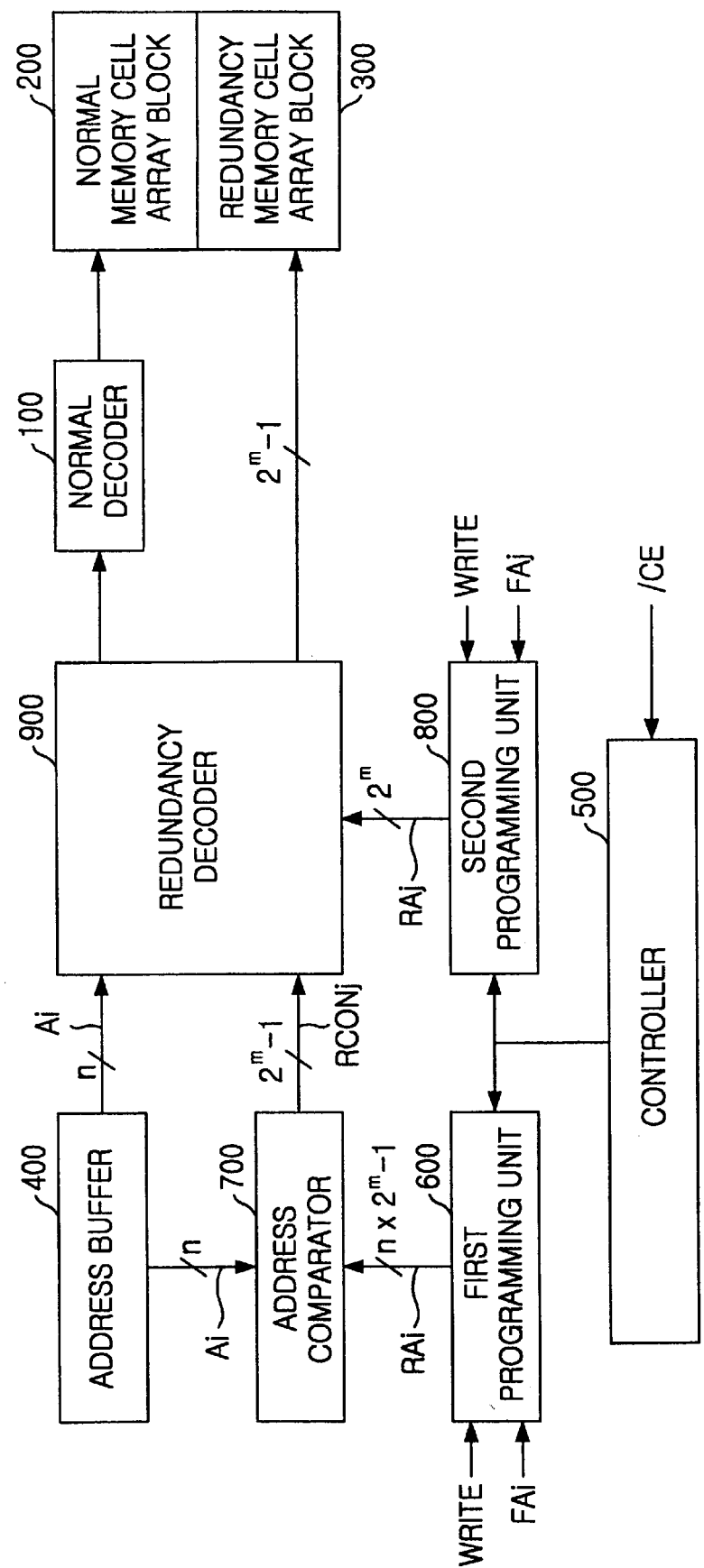
FIG. 1 is a configuration block diagram of a ferroelectric memory device having a redundancy circuit according to the present invention.

FIG. 1 is a configuration block diagram of a ferroelectric memory device having the redundancy circuit according to the present invention. As illustrated FIG. 1, a ferroelectric memory device comprises an address buffer 400, a normal decoder 100, a normal memory cell array block 200, a redundancy circuit, the redundancy circuit comprising a redundancy memory cell array block 300, a controller 500, a first programming unit 600, an address comparator 700, a second programming unit 800, and a redundancy decoder 900. If the redundancy memory cell array is $2^m-1$(m is an integer more that 1), the redundancy circuit can repair the failed cell of $2^m-1$.

In the ferroelectric memory device, a normal decoder 100 selects a cell in a normal memory cell array block 200, and if some cells in the normal memory cell array block 200 are failed, a redundancy circuit replaces the selection path of the cells with that of some cells in a redundancy memory cell array block 300. The present invention performs a repair by a software-wise method instead of a hardware-wise method.

The repair method of the redundancy circuit according to the invention differs from the repair method of a traditional redundancy circuit in which a repair is performed by cutting some fuses. Namely, in the invention, the redundancy circuit repairs a failed cell by comparing an inputted address with the fail address having already been stored, then selectively activating a normal cell block or a redundancy cell block according to the result of comparison.

A repairing process according to the redundancy circuit is performed as follows.

After a burn-in test, for example, when failed cells are small enough to be repaired, the number of failed cell is stored in a second programming unit 800 and the fail address is stored in a first programming unit 600. When a power turns on and a chip enable signal(/CE) is applied to a chip, a controller 500 outputs several control signals for controlling the first programming unit 600 and the second programming unit 800, then the data of those are stored in the second programming unit 800 and the first programming unit 600. Particularly, the first programming unit 600 is controlled by the controller 500 and stores the address of a failed cell after receiving a writing signal(WRITE) and a fail address(FAi). Also, the second programming unit 800 is controlled by the controller 500 and stores the number of a failed cell after receiving a writing signal(WRITE) and a failed number (FAj).

Then, when an address is applied to an address buffer 400, an address comparator 700 determines whether the address is a fail address. As the result of comparison, if the applied address is a fail address, a normal memory cell array block 200 is selected through a normal decoder 100, and if the applied address is a fail address, a redundancy memory cell array block 300 is selected. At this point, the address comparator 700 compares the address(Ai) of the address buffer 400 with the address(RAi) in stored in the first programming unit 600, and outputs a signal(RCONj) according to the results.

Then, in response to the address(Ai) of the address buffer 400, the output signal(RCONj) from the address comparator 700, and an output signal(RNj) from the second programming unit 800, the redundancy decoder 900 selects a normal memory cell array block 200 or a redundancy memory cell block 300. Namely, the redundancy decoder 900 selects one cell in the normal memory cell array block 200 if the input address is not a fail address, otherwise selects one cell in the redundancy memory cell block 300.

On the one hand, in the FIG. 1, if n were 4 and m were 2, a redundancy circuit needs 3 repair cells, a second programming unit of 2 bits, 3 first programming units of 4bits, and 3 address comparators. Thus, if a number of failed cells is less than 3 after a burn-in test, the chip can be repaired, but if the number is more than 4, the chip cannot be repaired.

Hereafter, the redundancy circuit of the invention is described in detail to appending drawings.

Figure 2:
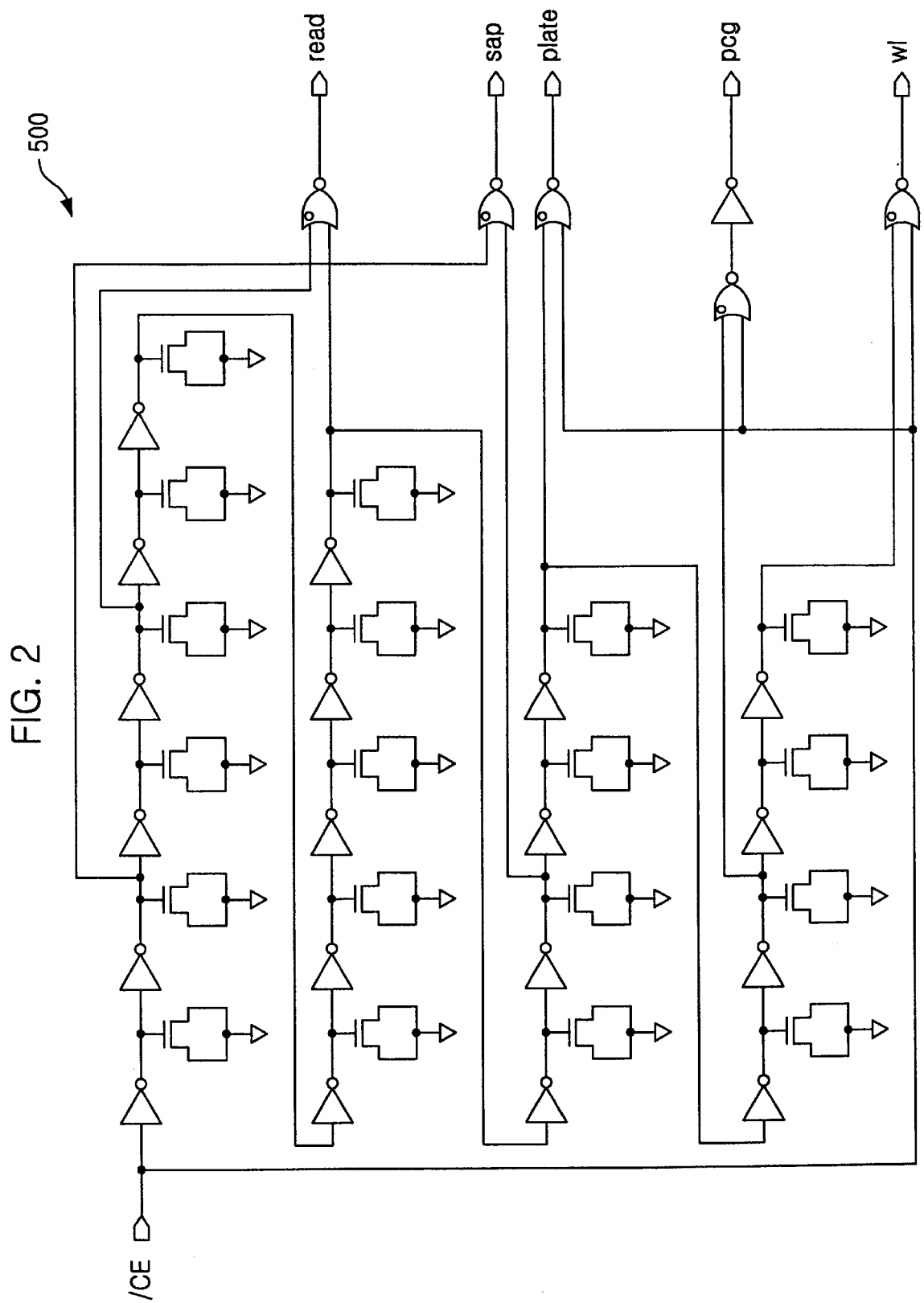
FIG. 2 is a controller circuit according to an embodiment of the present invention.
Figure 3:
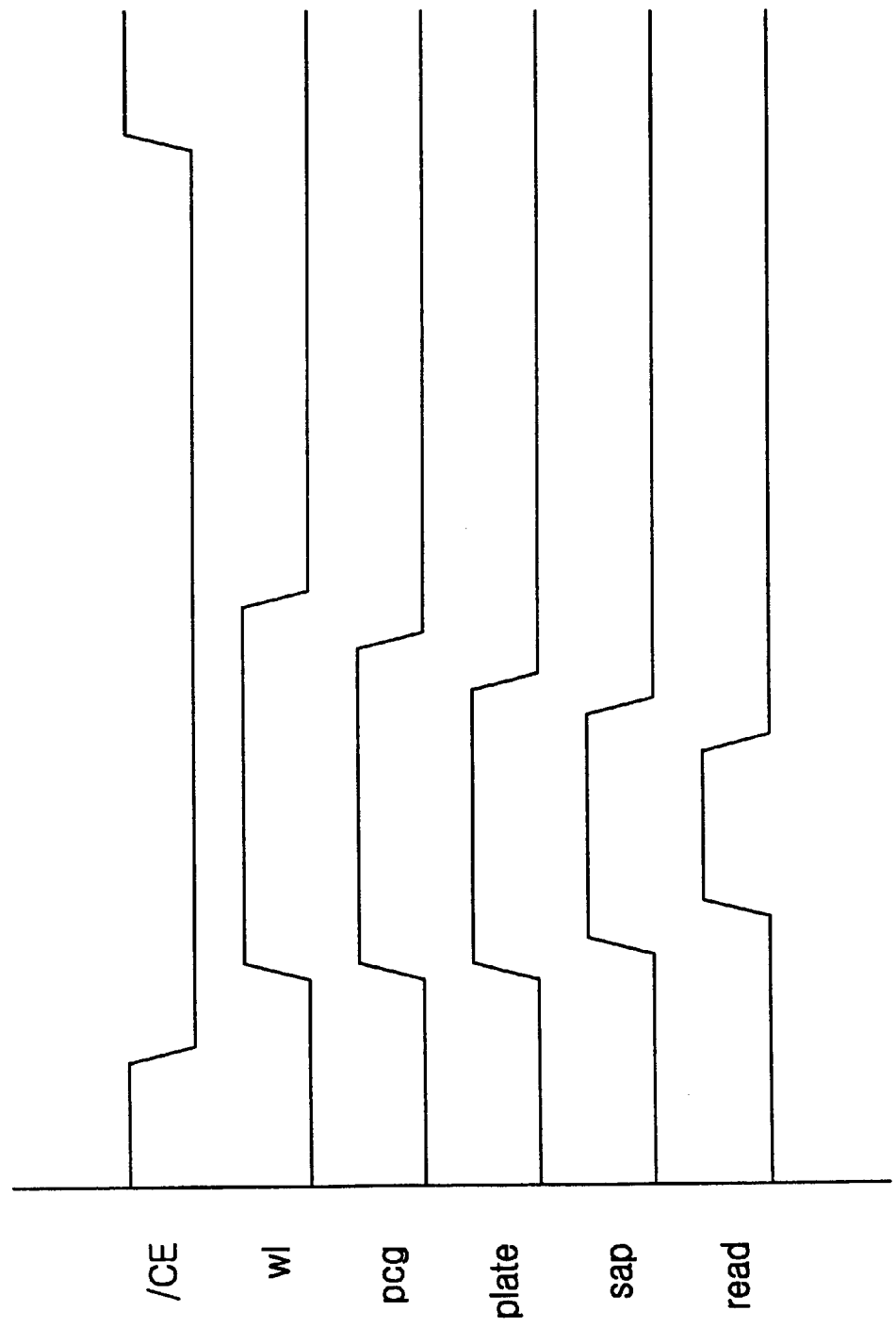
FIG. 3 is a waveform diagram of output control signals of FIG. 2.

FIG. 2 is a controller circuit according to an embodiment of the present invention and FIG. 3 is a waveform diagram of output control signals of FIG. 2. In these FIGS., the controller 500 comprises inverts, MOS-capacitor, and NOR gates which are driven in respond to a chip enable signal(/CE), and outputs pulse signals having a certain width as control signal. The control signals, such as "wl", "pcg", "plate", "slap", and "read", control the components involved in the first programming unit 600 and second programming unit 800. As illustrated FIG. 3, when the chip enable signal(/CE) is "LOW", the signals is activated to "HIGH", and the pulse(i.e ., pulse widths) of the activated signals become to be smaller in order to "wl", "pcg", "plate", sap" and "read".

Figure 4:
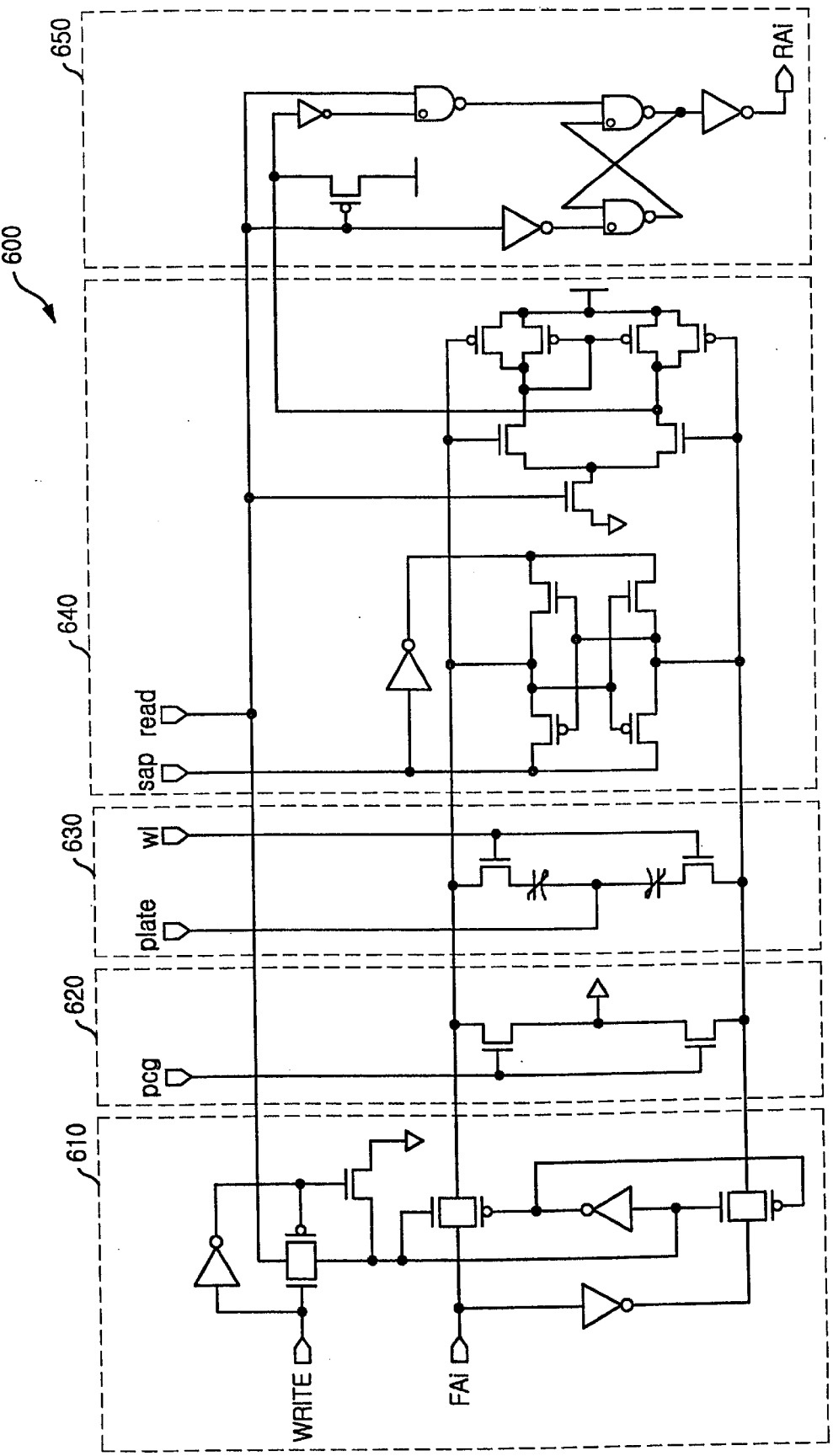
FIG. 4 is a circuit of a first programming unit according to an embodiment of the present invention.

FIG. 4 is a circuit of the first programming unit according to an embodiment of the present invention. As illustrated FIG. 4, the first programming unit 600 according to an embodiment of the invention has a data line(data_line) and reference line(ref_line) which have a complemental signal each other. Also, the programmer 600 has a storing unit 630 having a first and second ferroelectric capacitors for storing the fail address signal through the data line and reference line; a writing driving unit 610 for receiving the fail address signal(FAi) and a writing signal(WRITE) from the outside and storing the fail address signal in the storing unit 630; a lead driving unit 640, 650 for leading the signals stored in the storing unit 630 through the data line and reference line; arid a precharging unit 620 for precharging the data line and reference line. The lead driving unit is constructed of a sense amplifier 640 for amplifying the signal difference of the data line and reference line and a latch 650 for storing the signal from the sense amplifier 640.

When a fail address(FAi) and a writing signal(WRITE) and inputted in the first programming unit 600, the fail address is stored in the ferroelectric capacitor by control signals(pcg, plate, wl, sap, read) from the controller 500. Since a ferroelectric capacitor is non-volatile, the fail address is semipermenatly stored in turning off. After that, if a power turns on and a chip enable signal(/CE) is applied to the controller 500, the control signals(pcg, plate, wl, sap, read) are outputted from the controller 500, then the cell data of the first programming unit 600 is detected and amplified by the sense amplifier 640 and is stored in latch 650.

Figure 5:
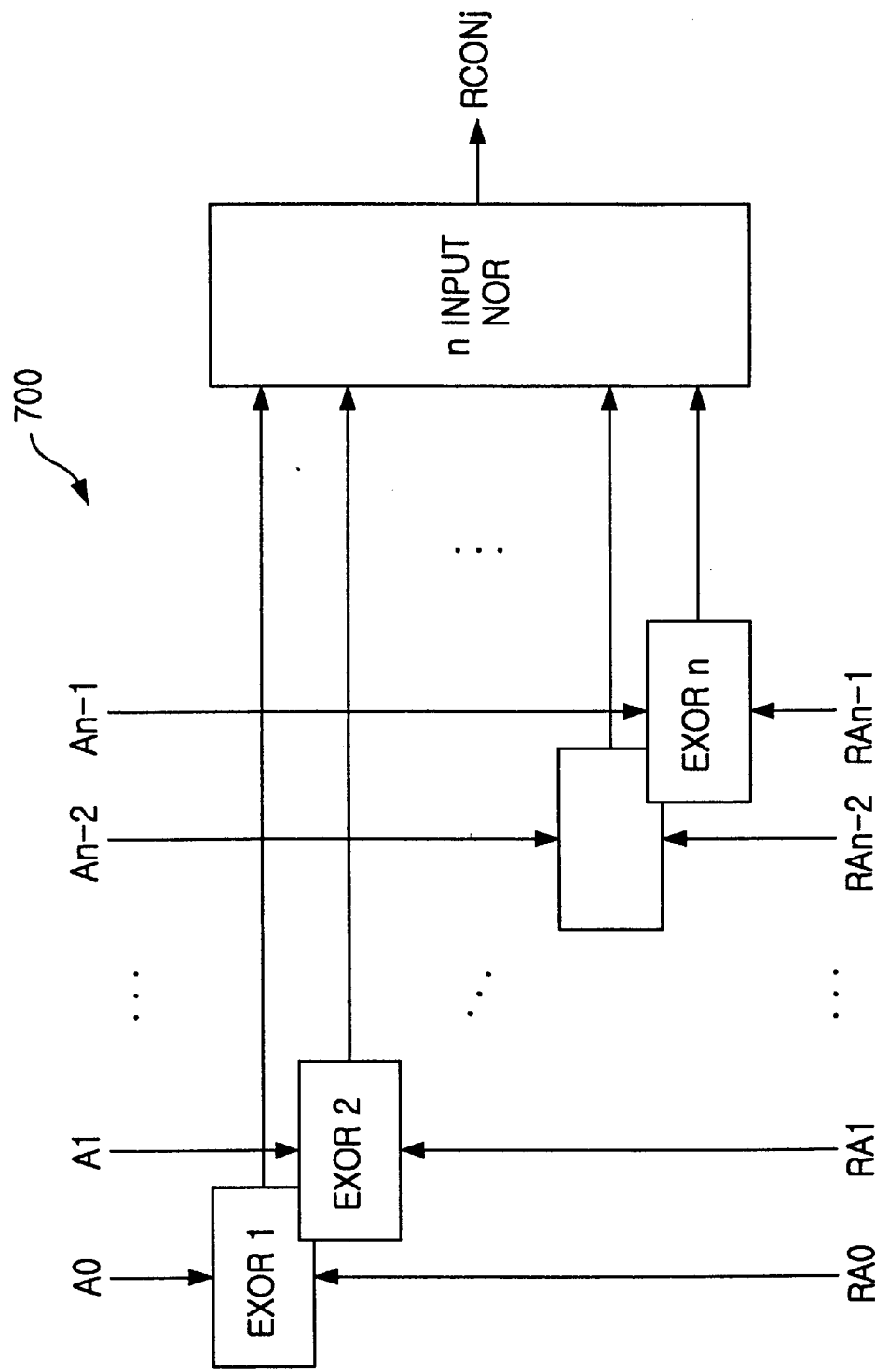
FIG. 5 is a circuit of an address comparator according to an embodiment of the present invention.

FIG. 5 is a circuit of an address comparator according to an embodiment of the present invention. As illustrated FIG. 5, the address comparator 700 comprises n EXOR gates in which n addresses($A0, A1, \ldots A_{n-1}$) from the address buffer 400 and n fail addresses($RA0, RA1, \ldots RA_{n-1}$)from the first programming unit 600 are inputted respectively; and n input NOR gates in which the outputs from the n EXOR are inputted respectively.

Thus, when the n bit address(Ai) from address buffer 400 and n bit fail address(RAi) in stored in the first programming unit 600 are respectively applied to the address comparator 700, the EXOR gates compare the addresses(Ai) with the fail addresses(RAi), and, if the addresses are same, the address acomparator outputs "0"(LOW), otherwise outputs "1"(HIGH). The outputs of the EXOR gates are inputted to the n input NOR gates, then the NOR gates output "RCONj" signals. The "RCONj"signals output "1"(HIGH) if all of the n bit addresses(Ai) from the address buffer 400 and n bit fail address(RAi) stored in the first programming unit 600 are same, otherwise output "0"(LOW).

Figure 6:
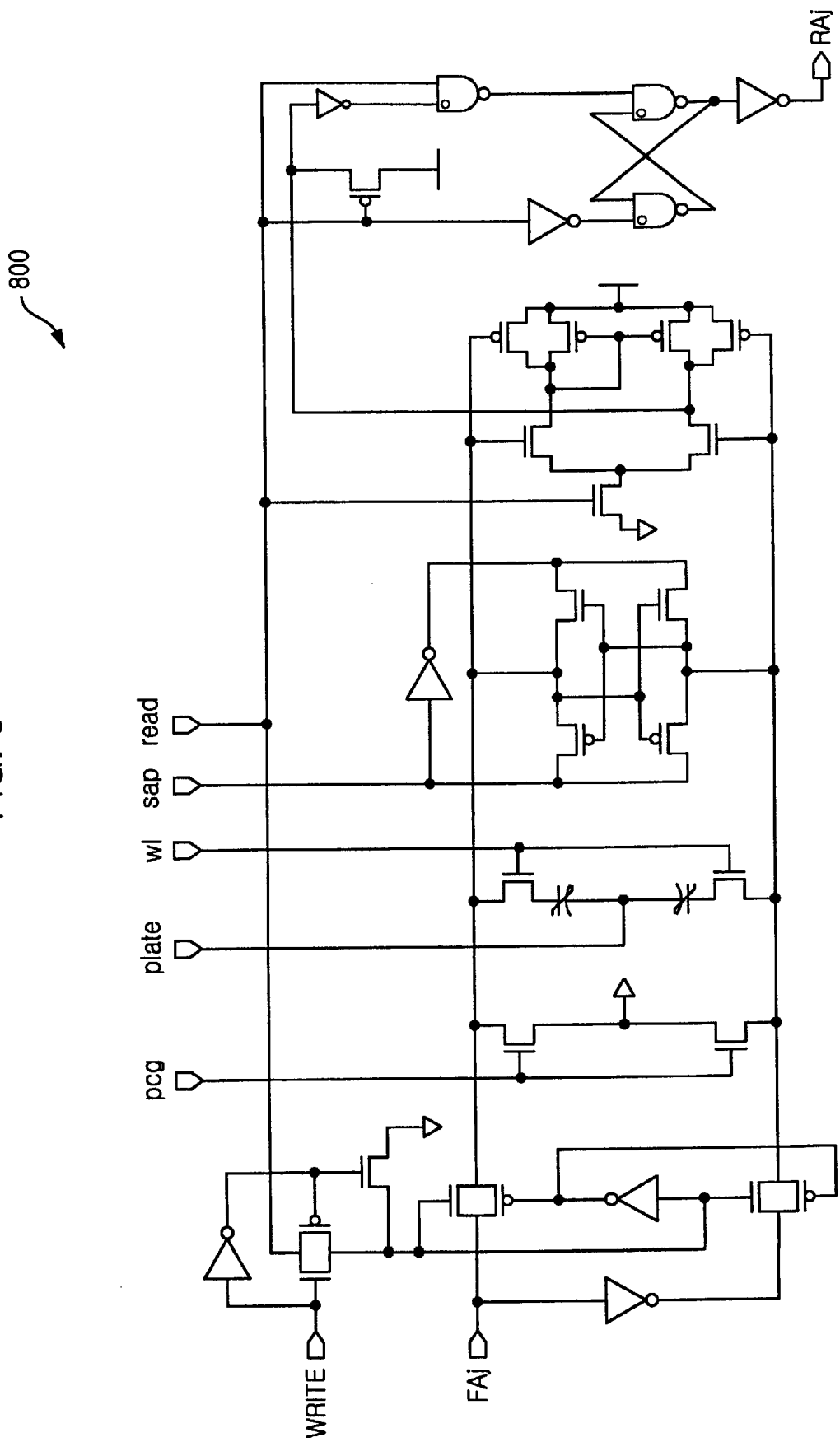
FIG. 6 is a circuit of a second programming unit according to an embodiment of the present invention.

FIG. 6 is a circuit of a second programming unit according to an embodiment of the present invention. Since the second programming unit 800 is similar to the configuration and operation of the first programming unit 600, the description of the second programming unit is omitted.

Figure 7:
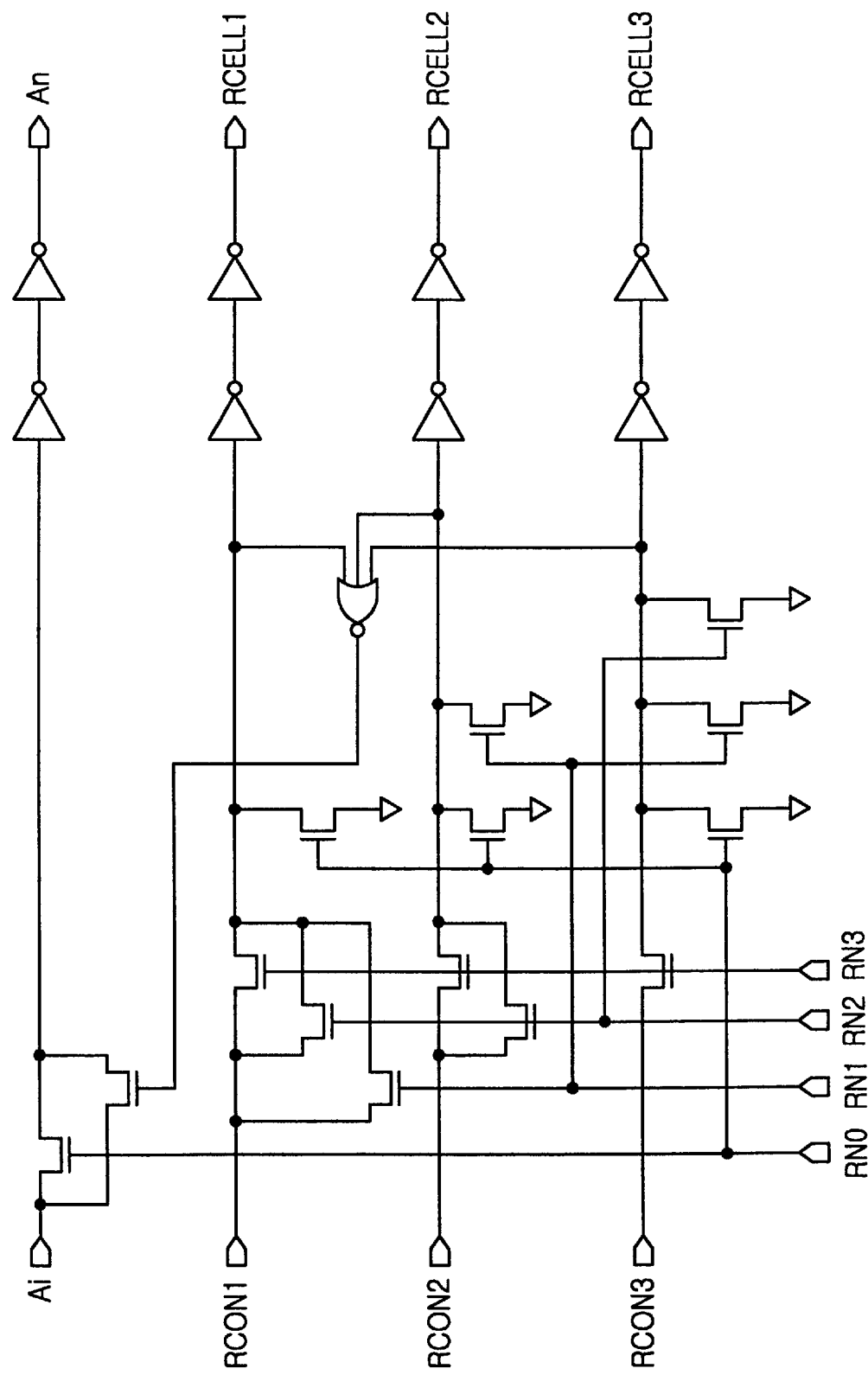
FIG. 7 is a circuit of a redundancy decoder according to an embodiment of the present invention.

FIG. 7 is a circuit of a redundancy decoder according to an embodiment of the present invention. In the FIG. 7, m is 2, namely, the maximum number of a failed cell being able to be repaired is 3.

If a fail number is zero, RN0 turns to "HIGH" regardless other circuits, then the output Ai from the address buffer 400 is applied to the normal decoder 100 and the decoder 100 selects the normal memory cell array block 200. If a fail number is one, RN1 turns lo "HIGH". At this moment, if RCON1 is "LOW", the output Ai from the address buffer is applied to normal decoder 100, but if RCON1 is "HIGH", the output of the address buffer is cut and the first repair cell(RECELL1) of the redundancy cell array block is selected. Similarly, If a fail number is three and all outputs of the address comparator 700 are "LOW", RN3 turns to "HIGH" and the output Ai from the address buffer are applied to normal decoder 200, but if the one of three outputs is "HIGH", the redundancy memory cell array block 300 is selected.

As described above, since the redundancy circuit according to the present invention performs a repair software-wise, even though fails are founded at a burn-in test after packaging, failed chips can be repaired. Thus, the yielding of a device is greatly improved.

Although a preferred embodiment of the present invention has been illustrated and described, various alternatives, modifications and equivalents may be used. Therefore, the foregoing description should not be taken as limiting the scope of the present invention which is defined by the appended claims.

What is claimed is:

1. A redundancy circuit of a ferroelectric memory device having an address buffer, a normal decoder, a normal memory cell array and a redundancy circuit, said redundancy circuit comprises:
   a redundancy memory cell array;
   a first programming unit for storing a failed address signal;
   a second programming unit for storing a failed number signal;
   a controller for generating control signals which control the first programming unit and the second programming unit;
   an address comparator for comparing the failed address stored in the first programming unit with the address of the address buffer when the stored failed number signal indicates that the number of failed memory cells is not zero; and
   a redundancy decoder for activating the normal memory cell array or the redundancy memory cell array, according to the address of the address buffer, the output signal of the address comparator and the output signal of the second programming unit.

2. The redundancy circuit of claim 1, wherein the first programming unit comprises:
   a data line and a reference line having a complemental signal each other;
   a storing unit for storing the fail address signal through the data line and the reference line;
   a writing driving unit for receiving the fail address data and a writing signal from the outside and storing the fail address signal in the storing unit;
   a lead driving unit for leading the signal stored in the storing unit through the data line and the reference line; and
   a precharging unit for precharging the data line and the reference line.

3. The redundancy circuit of claim 2, wherein the storing unit comprises:
   a first ferroelectric capacitor for storing the signal from the data line; and
   a second ferroelectric capacitor for storing the signal from the reference line.

4. The redundancy circuit of claim 2, wherein the lead driving unit comprises:
   a sense amplifier for amplifying the signal difference of the data line and the reference line; and
   a latch for storing the signal difference from the sense amplifier.

5. The redundancy circuit of claim 1, wherein the second programming unit comprises:
   a data line and a reference line having a complemental signal each other;
   a storing unit for storing the fail number signal through the data line and reference line;
   a writing driving unit for receiving the fail number data and a writing signal from the outside and storing the fail number signal in the storing unit;
   a lead driving unit for leading the signal stored in the storing unit through the data line and reference line; and
   a precharging unit for precharging the data line and reference line.

6. The redundancy circuit of claim 5, wherein the storing unit comprises:
   a first ferroelectric capacitor for storing the signal from the data line; and
   a second ferroelectric capacitor for storing the signal from the reference line.

7. The redundancy circuit of claim 5, wherein the lead driving unit comprises:
   a sense amplifier for amplifying the signal difference of the data line and reference line; and
   a latch for storing the signal from the sense amplifier.

8. The redundancy circuit of claim 1, wherein the address comparator comprises:
   a number of EXOR gates in which the address of the address buffer and the fail address stored in the first programming unit are inputted; and
   a number of NOR gate in which the output from the number of EXOR gates are inputted.

9. The redundancy circuit of claim 1, wherein the controller is driven after receiving a chip enable signal(/CE).

10. A redundancy method of a ferroelectric semiconductor device having an address buffer, a normal decoder, a normal memory cell array and a redundancy circuit, said redundancy circuit comprising a redundancy memory cell array, a first programming unit for storing a failed address signal, a second programming unit for storing a failed number signal, a controller for generating control signals which control the first programming unit and the second programming unit, an address comparator for comparing the failed address stored in the first programming unit with the address of the address buffer, and a redundancy decoder for activating the normal memory cell array or the redundancy memory cell array, said method comprising the steps of:
   (1) outputting a number of control signals for controlling the first programming unit and the second programming unit by the controller after a burn-in test;
   (2) storing the failed number in the second programming unit and the failed address in the first programming unit respectively by the control signals;
   (3) after a power turning on, rereading the stored failed number and the failed address by the control signals, and storing the data of those in the second programming unit and the first programming unit respectively;
   (4) inputting an address in the address buffer;

(5) comparing the failed address stored in the first programming unit with the address of the address buffer when the stored failed number in the second programming unit is not zero, and outputting the result of the comparison as an output signal;

(6) selectively activating the normal memory cell array or the redundancy memory cell array, according to the address of the address buffer, the output signal of the address comparator and the output signal of the second programming unit.

11. The method of claim 10, wherein the (2) step comprises the step of:

applying the failed address and writing signal from the outside to the first programming unit, and storing the failed address in the ferroelectric capacitor involved in the first programming unit by the control signals, while applying the failed number and writing signal from the outside to the second programming unit, and storing the failed number in the ferroelectric capacitor involved in the second programming unit by the control signals.

12. The method of claim 11, wherein the (3) step comprises the step of:

detecting and amplifying the stored failed address signal and failed number signal by the sense amplifier involved in the first programming unit and the second programming unit, and storing the signal in the latches involved in the first programming unit and the second programming unit.

13. The method of claim 12, wherein the (5) step comprises the steps of:

inputting the address of the address buffer and the failed address of the first programming unit into a number of EXOR gates involved in the address comparator; and inputting the outputs of the EXOR gates into a number of NOR gates involved in the address comparator and generating the output signal from the number of NOR gates.

14. The method of claim 13, wherein the (6) step comprises the steps of:

inputting the output address from the address buffer to the normal decoder and selecting the normal memory cell array, when the output signal of the second programming unit instructing no failed address;

cutting the output of the address buffer and selecting the redundancy memory cell array, when the output signal of the second programming unit instructing the existence of a failed address, and the output signal of the address comparator instructing the address of the address buffer and the failed address being same; and inputting the address of the address buffer to the normal decoder and selecting the normal memory cell array, when the output signal of the second programming unit instructing of the existence of a failed address exists, and the output signal of the address comparator instructing the address of the address buffer and the failed address being not same.

15. The method of claim 10, wherein the (10) step comprises the step of:

driving the controller by applying a chip enable signal(/CE).

* * * * *